(12) United States Patent
Lee et al.

(10) Patent No.: US 7,745,911 B2
(45) Date of Patent: Jun. 29, 2010

(54) SEMICONDUCTOR CHIP PACKAGE

(75) Inventors: Tae Soo Lee, Gyunggi-do (KR); Yun Hwi Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 28 days.

(21) Appl. No.: 12/155,867

(22) Filed: Jun. 11, 2008

(65) Prior Publication Data
US 2008/0303120 A1 Dec. 11, 2008

(30) Foreign Application Priority Data
Jun. 11, 2007 (KR) .................. 10-2007-0056852

(51) Int. Cl.
*H01L 23/552* (2006.01)
(52) U.S. Cl. ............... 257/660; 257/778; 257/E23.001
(58) Field of Classification Search ......... 257/659–660, 257/666–667, 678, 680, 687, 712, 717–718, 257/720, 773–774, 778, E23.001
See application file for complete search history.

(56) References Cited

U.S. PATENT DOCUMENTS 6,404,052 B1 * 6/2002 Kurita et al. ............... 257/737
6,952,049 B1 * 10/2005 Ogawa et al. ............... 257/700

FOREIGN PATENT DOCUMENTS

| JP | 2001-319987 | 11/2001 |
| KR | 2002-0003610 | 1/2002 |
| KR | 10-2006-0100169 | 9/2006 |
| KR | 10-2007-0024794 | 3/2007 |

* cited by examiner

*Primary Examiner*—Hoa B Trinh
(74) *Attorney, Agent, or Firm*—McDermott Will & Emery LLP (57) ABSTRACT

A semiconductor chip package includes a main board; a ceramic substrate having a cavity within which at least one chip is electrically mounted, the cavity being placed at a lower portion of the ceramic substrate facing the main board; and a conductive shielding layer provided with a predetermined thickness on the outside of the ceramic substrate. The ceramic substrate includes: at least one first ground line electrically connecting the conductive shielding layer with the main board; at least one second ground line electrically connecting the conductive shielding layer with the chip; and at least one signal line electrically connecting the chip with the main board. Thus, manufacturing costs are lowered because of the reduced number of components being used, miniaturization in device design can be achieved because of the small volume of the package, and the ground performance can be improved.

9 Claims, 5 Drawing Sheets

PRIOR ART

FIG. 1A

PRIOR ART

SEMICONDUCTOR CHIP PACKAGE

CROSS-REFERENCE TO RELATED APPLICATIONS

This application claims the priority of Korean Patent Application No. 2007-56852 filed on Jun. 11, 2007, in the Korean Intellectual Property Office, the disclosure of which is incorporated herein by reference.

BACKGROUND OF THE INVENTION

1. Field of the Invention

The present invention relates to a semiconductor chip package for packaging a semiconductor chip.

2. Description of the Related Art

In the electronics market, demands for portable systems are drastically increasing. To meet such increasing demands, slim and lightweight components must be mounted in those systems.

To realize such slim and lightweight components, there are needs for a technique for reducing a size of individual devices, a system-on-chip (SOC) technique for integrating a plurality of individual devices into one chip, and a system-in-package (SIP) technique for integrating a plurality of devices into one package.

Figure 1A:
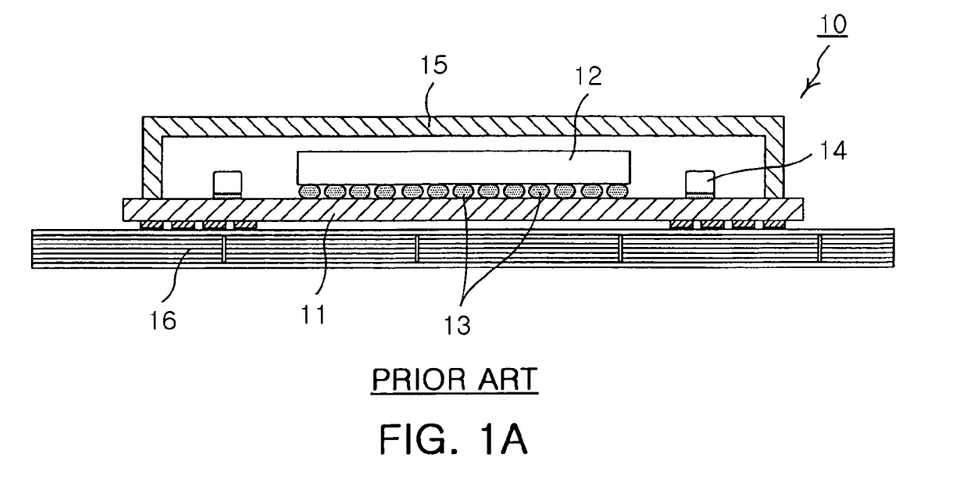
FIGS. 1A and 1B are cross-sectional views of related art semiconductor chip packages, respectively illustrating a semiconductor chip package including a chip mounted by a flip-chip method, and a semiconductor chip package including a chip mounted by a wire-bonding method.

FIG. 1A is a cross-sectional view illustrating an example of a related art semiconductor chip package. Referring to FIG. 1A, a related art semiconductor chip package 10 includes at least one chip 12 flip-chip bonded onto a substrate 11 by using a plurality of bump balls 13, and a metal can 15 formed of a metallic material on the substrate 11. The metal can 15 protects the chip 12 and a passive component from the external environment. Also, the metal can 15 prevents high-frequency signals generating during chip operation from affecting an adjacent package, or blocks external harmful electromagnetic waves.

Figure 1B:
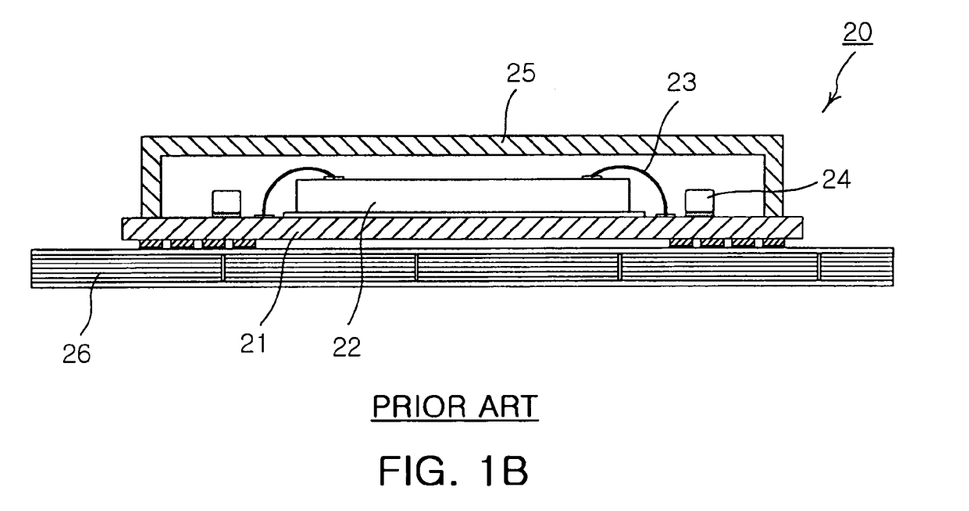

FIG. 1B is a cross-sectional view illustrating another example of a related art semiconductor chip package. Referring to FIG. 1B, a related art semiconductor chip package 20 includes at least one chip 22 wire-bonded onto a substrate 21 by using a plurality of metal wires 23, and a metal can 25 formed of a metallic material on the substrate 21. The metal can 25 protects the chip 22 and a passive component 24 from the external environment. Also, the metal can 25 prevents high-frequency signals generating during chip operation from affecting an adjacent package, or blocks external harmful electromagnetic waves.

Undescribed reference numerals 16 and 26 in FIGS. 1A and 1B indicate main boards on which the semiconductor chip packages 10 and 20 are mounted, respectively.

In the related art semiconductor chip packages 10 and 20, the passive components 14 and 24 such as a resistor, a capacitor and a coil are mounted on the substrates 11 and 21 besides the chips 12 and 22, and the metal cans 15 and 25 are also mounted on the substrates 11 and 21 to shield the chips 11 and 22 and the passive component 14 and 24 from the external environment. For this reason, the related art semiconductor chip packages 10 and 20 have limitations in that assembly processes of the semiconductor chips 10 and 20 are complicated and take long time to complete, lowering operational productivity. Also, miniaturization of the semiconductor chip packages 10 and 20 is limited because of the metal cans 15 and 25.

Also, the substrates 11 and 21 must include separate ground lines (not shown) electrically connected with ground terminals of the chips 12 and 22, and separate ground lines (not shown) electrically connected with the metal cans 15 and 25 mounted thereon. Hence, the substrate structure is complicated, increasing manufacturing costs.

SUMMARY OF THE INVENTION

An aspect of the present invention provides a semiconductor chip package, which can simplify a package manufacturing process, reduce the number of components to lower the manufacturing costs, reduce a package volume to contribute miniaturization of a package, and improve ground performance.

According to an aspect of the present invention, there is provided a semiconductor chip package including: a main board; a ceramic substrate having a cavity within which at least one chip is electrically mounted, the cavity being placed at a lower portion of the ceramic substrate facing the main board; and a conductive shielding layer provided with a predetermined thickness on the outside of the ceramic substrate, wherein the ceramic substrate includes: at least one first ground line electrically connecting the conductive shielding layer with the main board; at least one second ground line electrically connecting the conductive shielding layer with the chip; and at least one signal line electrically connecting the chip with the main board.

The conductive shielding layer may cover a top surface and outer side surfaces of the ceramic substrate.

The conductive shielding layer may include bar-shaped patterns alternately disposed on a top surface of the ceramic substrate.

The conductive shielding layer may include a helical pattern on a top surface of the ceramic substrate.

The first ground line may include a first conductive via penetrating the ceramic substrate and electrically connecting the conductive shielding layer with a ground terminal of the main board.

The second ground line may include a second conductive via penetrating the ceramic substrate and electrically connecting the conductive shielding layer with a ground terminal of the chip.

The signal line may include: an inner pattern provided in the ceramic substrate and electrically connected with a signal terminal of the chip; and a signal via formed in the ceramic substrate and electrically connecting the inner pattern with a signal terminal of the main board.

The cavity may be filled with a resin filler covering and protecting the chip.

The chip may be mounted to the ceramic substrate by flip-chip bonding.

The chip may be mounted to the ceramic substrate by wire-bonding.

According to another aspect of the present invention, there is provided a semiconductor chip package including: a main board; a ceramic substrate having a cavity within which at least one chip is electrically mounted, the cavity being placed at a lower portion of the ceramic substrate facing the main board; and a shielding substrate stacked on the ceramic substrate and including a shielding layer, wherein the ceramic substrate includes: at least one third ground line electrically connecting the shielding layer of the shielding substrate with the main board; at least one fourth ground line electrically connecting the shielding layer of the shielding substrate with the chip; and at least one signal line electrically connecting the chip with the main board.

The shielding layer may include: an upper conductive shielding layer provided at an upper portion of the shielding substrate; a lower conductive shielding layer provided at a lower portion of the shielding substrate; and an intermediate conductive shielding layer disposed between the upper conductive shielding layer and the lower conductive shielding layer.

The upper conductive shielding layer and the intermediate conductive shielding layer may be connected through a conductive via, and the upper conductive shielding layer and the lower conductive shielding layer may be connected through another conductive via.

The upper conductive shielding layer may cover the ceramic substrate.

The upper conductive shielding layer may include bar-shaped patterns alternately disposed on the ceramic substrate.

The upper conductive shielding layer may include a helical pattern disposed on the ceramic substrate.

The third ground line may include a third conductive via penetrating the ceramic substrate and electrically connecting the shielding layer with a ground terminal of the main board.

The fourth ground line may include a fourth conductive via penetrating the ceramic substrate and electrically connecting the shielding layer with a ground terminal of the chip.

The signal line may include: an inner pattern provided in the ceramic substrate and electrically connected with a signal terminal of the chip; and a signal via formed in the ceramic substrate and electrically connecting the inner pattern with a signal terminal of the main board.

The cavity may be filled with a resin filler covering and protecting the chip.

The chip may be mounted to the ceramic substrate by flip-chip bonding.

The chip may be mounted to the ceramic substrate by wire-bonding.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2A:
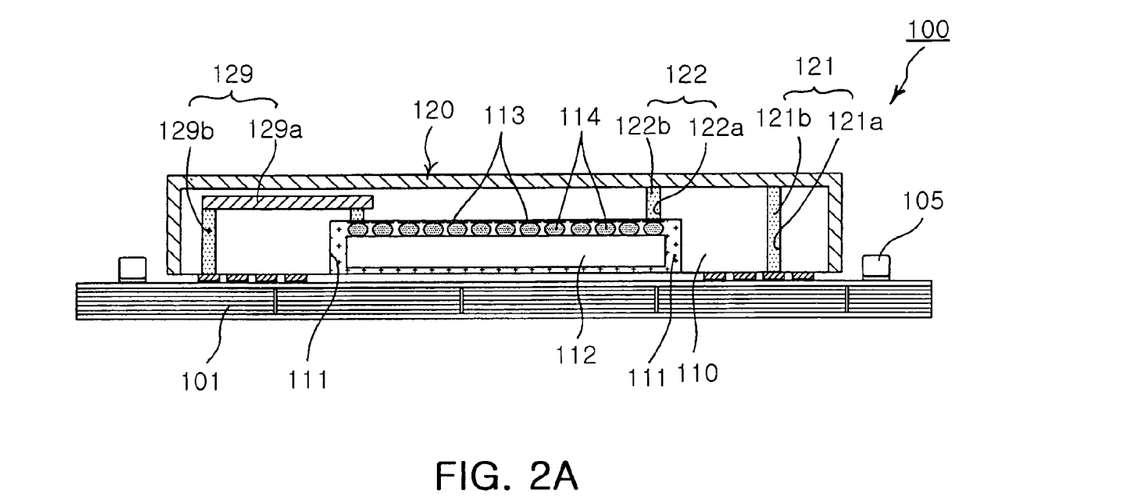
FIGS. 2A and 2B are cross-sectional views of semiconductor chip packages according to an embodiment of the present invention, respectively illustrating a semiconductor chip package including a chip mounted by a flip-chip method and a semiconductor chip package including a chip mounted by a wire-bonding method.
Figure 2B:
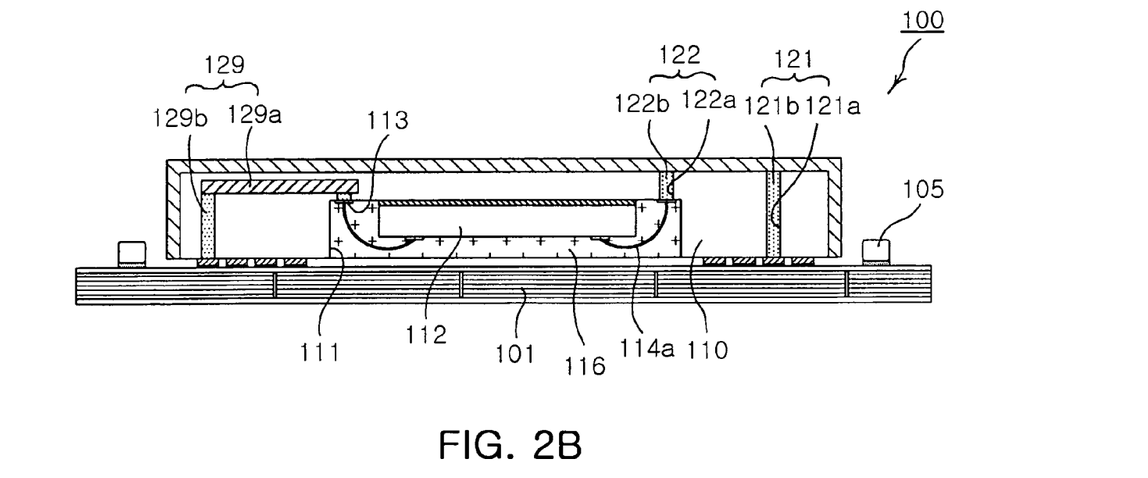

FIGS. 2A and 2B are cross-sectional views of semiconductor chip packages according to an embodiment of the present invention. FIG. 2A illustrates a semiconductor chip package in which a chip is mounted by a flip-chip method, and FIG. 2B illustrates a semiconductor chip package in which a chip is mounted by a wire-bonding method.

The semiconductor chip package 100 according to the embodiment of the present invention includes a main board 101, a ceramic substrate 110 and a conductive shielding layer 120.

The main board 101 is a main substrate on which the ceramic substrate 110 is mounted by a land grid array (LGA) method or a ball grid array (BGA) method using a plurality of solder balls as a medium, and a plurality of passive components 105 are mounted.

The ceramic substrate 110 has a cavity 111 with a predetermined size, which is open at one side facing the main board 101. The ceramic substrate 110 may have a stack structure of ceramic sheets that are stacked forming the cavity 111 therein.

At least one chip 112 is electrically mounted within the cavity 111. Referring to FIG. 2A, the chip 112 is mounted within the cavity 111 by a flip-chip bonding method such that a plurality of terminals provided on an active surface of the chip 112 are electrically connected with a plurality of pads 113 provided on a closed side of the cavity 111 by using bump balls 114 placed on the pads 113. Referring to FIG. 2B, the chip 112 is mounted by a wire-bonding method such that the plurality of terminals provided on the active surface of the chip 112 are electrically connected to the plurality of pads 113 provided on the closed side of the cavity 111 by using a plurality of metal wires 114a.

According to a set device employing the semiconductor chip package 100, the chip 112 may be one of a memory chip such as a static random access memory (SRAM) and a dynamic random access memory (DRAM), a digital integrated circuit chip, a radio frequency (RF) integrated circuit chip, and a baseband chip.

The cavity 111 is filled with a resin filler 116 to protect the chip 112 mounted by the flip-chip bonding method or the wire bonding method from the external environment.

The chip 112 mounted within the cavity 111 is disposed in a closed space formed between the main board 101 and the ceramic substrate 110, thereby minimizing signal propagation from the chip 112 to the outside.

The ceramic substrate 110 may be a low temperature co-fired ceramic (LTCC) substrate provided by an LTCC technique. In the LTCC technique, passive components for realizing a given circuit, such as resistors, inductors, capacitors, filters, baluns and couplers are realized in a plurality of glass-ceramic-based green sheets by using a photo patterning process and a screen printing process using a highly conductive material such as Ag and Cu, then the green sheets are stacked, and a stack structure thereof is co-fired below 1000° C.

Also, the conductive shielding layer 120 is a shielding member of a highly conductive metal, which is provided with a predetermine thickness on the outside of the ceramic substrate 110.

Figure 3A:
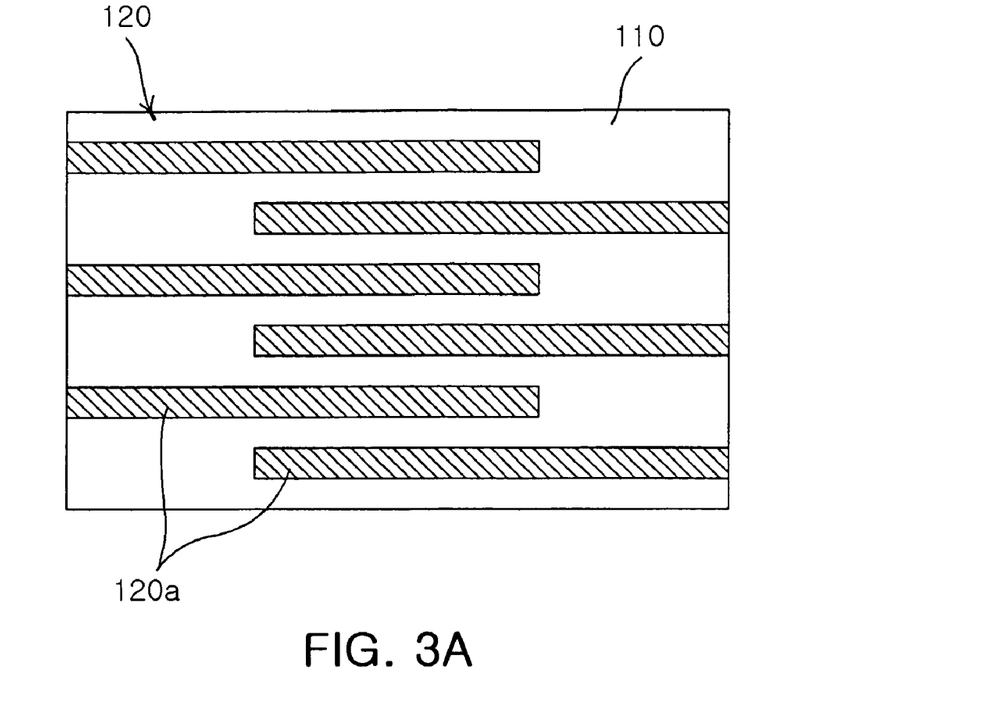
FIGS. 3A and 3B are views of conductive shielding layers used in the semiconductor chip packages of FIGS. 2A and 2B, respectively provided in the form of bar-shaped patterns and a helical pattern.
Figure 3B:
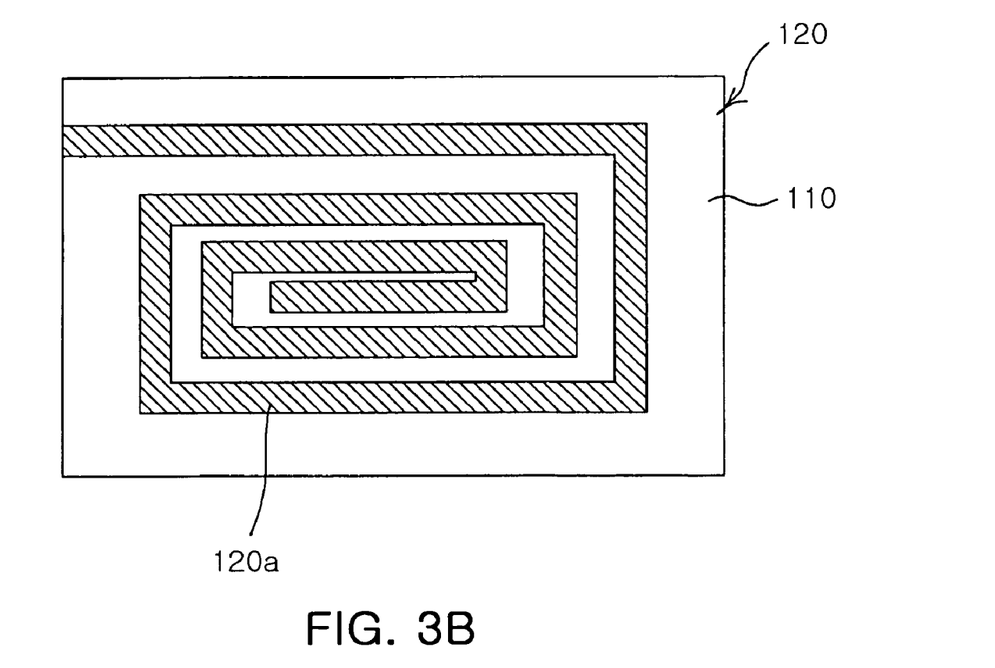

The conductive shielding layer 120 may cover the entire top surface and outer side surfaces of the ceramic substrate 110 as illustrated in FIGS. 2A and 2B. However, the present invention is not limited thereto. As shown in FIGS. 3A and 3B, the conductive shielding layer 120 may be implemented in the form of bar-shaped patterns 120a alternately disposed on the top surface of the ceramic substrate 110, or in the form of a helical pattern 120b provided on the top surface of the ceramic substrate 110.

The ceramic substrate 110 includes at least one first ground line 121 electrically connecting the conductive shielding layer 120 with the main board 101. The first ground line 121 may also be referred to as a first conductive via. The first ground line 121, i.e., the first conductive via, includes a first via hole 121a vertically penetrating the ceramic substrate 110, and a conductive material 121b provided in the first via hole 121a and electrically connecting the conductive shielding layer 120 with a ground terminal among a plurality of terminals provided on a top surface of the main board 101.

The ceramic substrate 110 includes at least one second ground line 122 to electrically connect the conductive shielding layer 120 with the chip 112. The second ground line 122 may also be referred to as a second conductive via. The second ground line 122, i.e., the second conductive via, includes a second via hole 122a vertically penetrating the ceramic substrate 110 corresponding to the cavity 111 within which the chip 112 is mounted, and a conductive material 122b provided in the second via hole 122a and electrically connecting the conductive shielding layer 120 with a ground terminal among the plurality of terminals provided on the active surface of the chip 112.

The ceramic substrate 110 includes at least one signal line 129 electrically connecting the chip 112 with the main board 101. The signal line 129 includes an inner pattern 129a and a signal via 129b. The inner pattern 129a is provided in the ceramic substrate 110 and electrically connected with a signal terminal among the plurality of terminals provided on the active surface of the chip 112. The signal via 129b includes a signal via hole vertically penetrating the ceramic substrate 110, and a conductive material filled in the signal via hole and electrically connecting the inner pattern 129a with a signal terminal among the plurality of terminals provided on the main board 101.

Figure 4A:
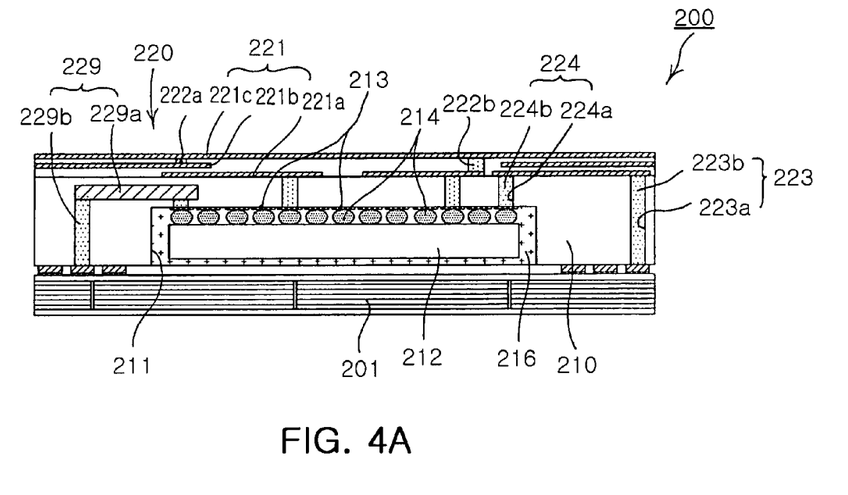
FIGS. 4A and 4B are cross-sectional views of semiconductor chip packages according to another embodiment of the present invention, respectively illustrating a semiconductor chip package including a chip mounted by a flip-chip method and a semiconductor chip package including a chip mounted by a wire-bonding method.
Figure 4B:
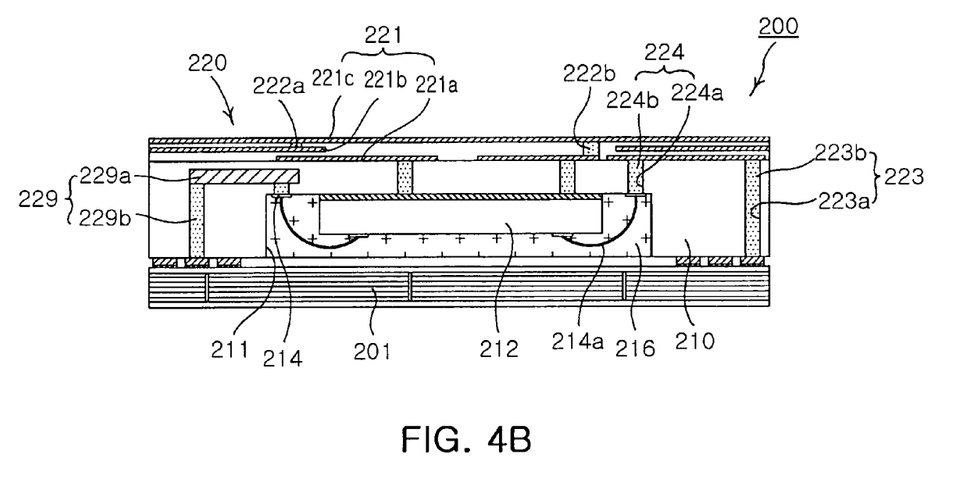

FIGS. 4A and 4B are cross-sectional views of semiconductor chip packages according to another embodiment of the present invention. FIG. 4A illustrates a semiconductor chip package in which a chip is mounted by a flip-chip method, and FIG. 4B illustrates a semiconductor chip package in which a chip is mounted by a wire-bonding method.

A semiconductor chip package 200 according to another embodiment of the present invention includes a main board 201, a ceramic substrate 210 and a shielding substrate 220.

As in the embodiment of FIGS. 2A and 2B, the main board 201 according to the current embodiment is a main substrate on which the ceramic substrate 210 is mounted by a BGA or LGA method.

As in the embodiment of FIGS. 2A and 2B, the ceramic substrate 210 has a cavity 211 which has a predetermined size and is open at one side facing the main board 201. The ceramic substrate 210 is a substrate member having a stack structure of ceramic sheets that are stacked forming the cavity 211.

At least one chip 212 is mounted within the cavity 211. Referring to FIG. 4A, the chip 212 is mounted within the cavity 211 by a flip-chip bonding method such that a plurality of terminals provided on an active surface of the chip 212 are electrically connected with a plurality of pads 213 provided on a closed side of the cavity 211 by using bump balls 214 placed on the pads 213. Referring to FIG. 4B, the chip 212 is mounted within the cavity 211 by a wire-bonding method such that the plurality of terminals provided on the active surface of the chip 212 are electrically connected with the plurality of pads 213 on the closed side of the cavity 211 by using a plurality of metal wires 214a.

The cavity 211 is filled with a resin filler 216 to protect the chip 212 mounted by the flip-chip bonding method or the wire-bonding method.

The chip 212 mounted within the cavity 211 is disposed in a closed space between the main board 201 and the ceramic substrate 210. Thus, signal propagation from the chip 212 to the outside is minimized.

The shielding substrate 220 may be a substrate member integrally stacked on a top surface of the ceramic substrate 210.

Figure 5:
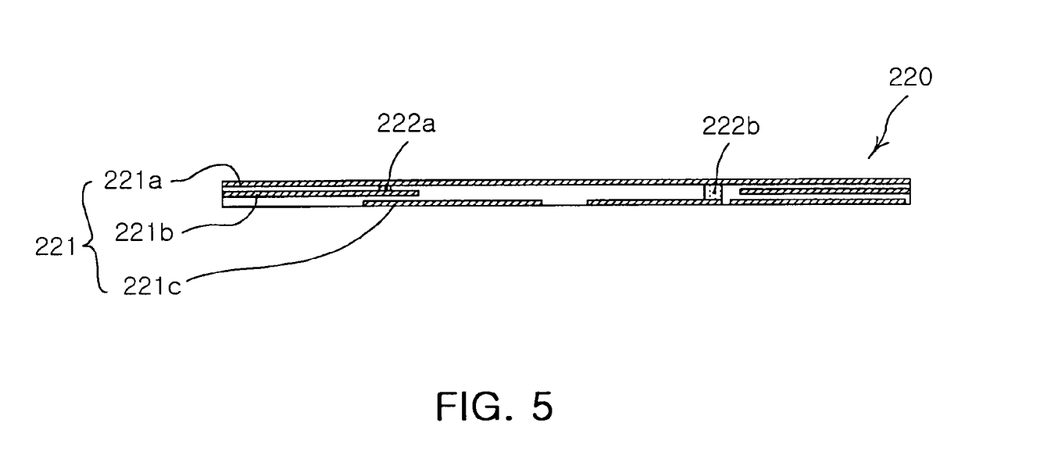
FIG. 5 is a cross-sectional view of a shielding substrate used in the semiconductor chip packages of FIGS. 4A and 4B.

As illustrated in FIG. 5, the shielding substrate 220 is a ceramic substrate having a stack structure of a plurality of ceramic sheets and including a shielding part 221. The shielding part 221 of the shielding substrate 220 includes an upper conductive shielding layer 221c, a lower conductive shielding layer 221a, and an intermediate conductive shielding layer 221b. The upper conductive shielding layer 221c includes an electrode formed by printing an electrode pattern on the uppermost ceramic sheet, and is disposed at an upper portion of the shielding substrate 220. The lower conductive shielding layer 221a includes an electrode formed by printing an electrode pattern on the lowermost ceramic sheet, and is disposed at a lower portion of the shielding substrate 220. The intermediate conductive shielding layer 221b includes an electrode formed by printing an electrode pattern on an intermediate ceramic sheet therebetween.

The upper conductive shielding layer 221c is connected with the intermediate conductive shielding layer 221b through at least one conductive via 222a. The upper conductive shielding layer 221c is connected with the lower conductive shielding layer 221a through another conductive via 222b.

The upper conductive shielding layer 221c provided at the upper portion of the shielding substrate 220 may cover the entire top surface of the shielding substrate 220. However, the present invention is not limited thereto. Like the conductive shielding layer 120 of FIGS. 3A and 3B, the upper conductive shielding layer 221c may be realized as bar-shaped patterns alternately disposed on the top surface of the shielding substrate 220, or as a helical pattern on the top surface of the shielding substrate 220.

The ceramic substrate 210 on which the shielding substrate 220 is stacked includes at least one third ground line 223 electrically connecting the shielding part 221 with the main board 201. The third ground line 223 may also be referred to as a third conductive via. The third ground line 223, i.e., the third conductive via, includes a third via hole 223a vertically penetrating the ceramic substrate 210 and a conductive material 223b provided in the third via hole 223a and electrically connecting a ground terminal among a plurality of terminals provided on a top surface of the main board 201 with the lower conductive shielding layer 221a of the shielding part 221.

The ceramic substrate 210 includes at least one fourth ground line 224 to electrically connect the shielding part 221 with the chip 212. The fourth ground line 224 may also be referred to as a fourth conductive via. The fourth ground line 224, i.e., the fourth conductive via, includes a fourth via hole 224a vertically penetrating the ceramic substrate 212 corresponding to the cavity 211 within which the chip 212 is mounted, and a conductive material 224b provided in the fourth via hole 224a and electrically connecting the lower conductive shielding layer 221a of the shielding part 221 with a ground terminal among the plurality of terminals provided on the active surface of the chip 212.

The ceramic substrate 210 includes at least one signal line 229 electrically connecting the chip 212 with the main board 201. The signal line 229 includes an inner pattern 229a and a signal via 229b. The inner pattern 229a is provided in the ceramic substrate 210 to be electrically connected with a signal terminal among the plurality of terminals provided on the active surface of the chip 212. The signal via 229b includes a signal via and a conductive material filling the signal via, and electrically connects the inner pattern 229a with a signal terminal of a plurality of terminal provided on the main board 201.

The ceramic substrate 210 and the shielding substrate 220 may be a low temperature co-fired ceramic (LTCC) substrate provided by an LTCC technique. In the LTCC technique, passive components for realizing a given circuit, such as resistors, inductors, capacitors, filters, baluns and couplers are realized in a plurality of glass-ceramic-based green sheets by using a photo patterning process and a screen printing process using a highly conductive material such as Ag and Cu, then the green sheets are stacked, and a stack structure thereof is co-fired below 1000° C.

Accordingly, the passive components to be mounted on the main board 101, such as the capacitors, the resistors and the inductors, can be mounted in the form of patterns in the ceramic substrate 210 and the shielding substrate 220.

Electromagnetic signals are generated from the chips 112 and 212 provided in the semiconductor chip packages 100 and 200. However, according to the embodiment of FIGS. 2A and 2B, the electromagnetic signals are transmitted to the ground terminal of the main board 101 through the first and second ground lines 121 and 122 provided in the ceramic substrate 110. Also, according to the embodiment of FIGS. 4A and 4B, the electromagnetic signals are transmitted to the ground terminal of the main board 201 through the third and fourth ground lines 223 and 224 provided in the ceramic substrate 210 according to the embodiment of FIGS. 4A and 4B.

The chip 112 of FIGS. 2A and 2B is disposed in a closed space between the ceramic substrate 110 and the main board 101, and the chip 212 of FIGS. 4A and 4B is also disposed in a closed space between the ceramic substrate 210 and the main board 201, thereby minimizing the influence of harmful electromagnetic waves to adjacent electronic components.

Accordingly, the harmful electromagnetic signals generated from the chips 112 and 212 are prevented from undesirably affecting other adjacent electronic components and thus causing deterioration of a circuit function and defective operations of a device.

According to the embodiment of FIGS. 2A and 2B, harmful electromagnetic signals generated from the outside are transmitted into the ground terminal of the main boards 101 through the conductive shielding layer 120 provided on the ceramic substrate 110, and the first ground line 121 provided in the ceramic substrate 110. According to the embodiment of the FIGS. 4A and 4B, the harmful electromagnetic signals generated from the outside are transmitted to the ground terminal of the main board 201 through the shielding part 221 on the ceramic substrate 210, and the third ground line 223 in the ceramic substrate 210.

Therefore, the external harmful electromagnetic signals are prevented from undesirably affecting the chips 112 and 212 respectively mounted within the cavities 111 and 221 of the packages 100 and 200 and thus causing deterioration of circuit functions and defective operations of a device.

According to the embodiment of FIGS. 2A and 2b, when the ceramic substrate 110 on which the conductive shielding layer 120 is provided is electrically mounted on the main board 101, the conductive shielding layer 120 conveniently forms a circuit with the ground terminal of the main board 101. Likewise, according to the embodiment of FIGS. 4A and 4B, when the ceramic substrate 210 on which the shielding substrate 220 is stacked is electrically mounted on the main board 201, the shielding substrate 220 conveniently forms a circuit with the ground terminal of the main board 201.

According to the present invention, a chip is disposed within a cavity of a ceramic substrate mounted on a main board. Then, a conductive shielding layer is provided on the outside of the ceramic substrate, or a shielding substrate is integrally stacked on the ceramic substrate. Also, first and second ground lines electrically connected with the main board are provided in the ceramic substrate. Accordingly, electromagnetic signals generated during chip operation are prevented from undesirably affecting adjacent electronic components, or external harmful electromagnetic waves are blocked. Thus, defective operations of a device can be prevented, reliability of the package can be improved, and stable electrical characteristics can be achieved.

A package manufacturing process is simplified by conveniently performing the following processes: a process of mounting a metal can for chip protection on the ceramic substrate, a shielding process for protecting the chip from the external environment without using the metal can, and a ground process of connecting the chip with the ground terminal of the main board. Also, manufacturing costs are lowered because of the reduced number of components being used, miniaturization in device design can be achieved because of the small volume of the package, and the ground performance can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor chip package comprising:
a main board;
a ceramic substrate having a cavity within which at least one chip is electrically mounted, the cavity being placed at a lower portion of the ceramic substrate facing the main board; and
a conductive shielding layer provided with a predetermined thickness on the outside of the ceramic substrate,
wherein the ceramic substrate comprises:
at least one first ground line electrically connecting the conductive shielding layer with the main board;
at least one second ground line electrically connecting the conductive shielding layer with the chip; and
at least one signal line electrically connecting the chip with the main board.

2. The semiconductor chip package of claim 1, wherein the conductive shielding layer covers a top surface and outer side surfaces of the ceramic substrate.

3. The semiconductor chip package of claim 1, wherein the conductive shielding layer comprises bar-shaped patterns alternately disposed on a top surface of the ceramic substrate.

4. The semiconductor chip package of claim 1, wherein the conductive shielding layer comprises a helical pattern on a top surface of the ceramic substrate.

5. The semiconductor chip package of claim 1, wherein the first ground line comprises a first conductive via penetrating the ceramic substrate and electrically connecting the conductive shielding layer with a ground terminal of the main board.

6. The semiconductor chip package of claim 1, wherein the second ground line comprises a second conductive via penetrating the ceramic substrate and electrically connecting the conductive shielding layer with a ground terminal of the chip.

7. The semiconductor chip package of claim 1, wherein the signal line comprises:
   an inner pattern provided in the ceramic substrate and electrically connected with a signal terminal of the chip; and
   a signal via formed in the ceramic substrate and electrically connecting the inner pattern with a signal terminal of the main board.

8. The semiconductor chip package of claim 1, wherein the cavity is filled with a resin filler covering and protecting the chip.

9. The semiconductor chip package of claim 1, wherein the chip is mounted to the ceramic substrate by flip-chip bonding.

* * * * *